United States Patent [19]

Yamaguchi et al.

[11] Patent Number: 4,925,755
[45] Date of Patent: May 15, 1990

[54] METHOD OF CORRECTING DEFECT IN CIRCUIT PATTERN

[75] Inventors: Hiroshi Yamaguchi, Fujisawa; Keiya Saito, Yokohama; Akira Shimase, Yokohama; Satoshi Haraichi, Yokohama; Susumu Aiuchi, Yokohama; Nobuyuki Akiyama, Yokohama; Shinji Kuniyoshi, Tokyo; Takeshi Kimura, Higashimurayama, all of Japan

[73] Assignee: Hitachi, Ltd., Tokyo, Japan

[21] Appl. No.: 152,159

[22] Filed: Feb. 4, 1988

[30] Foreign Application Priority Data

Feb. 27, 1987 [JP] Japan ............... 62-42542

[51] Int. Cl.⁵ .................................. G03F 1/00
[52] U.S. Cl. ...................... 430/5; 430/324; 430/323; 250/492.3; 356/237; 378/35
[58] Field of Search ........... 430/5, 321, 324, 313; 427/140, 142; 378/35; 250/492.3; 356/237

[56] References Cited

U.S. PATENT DOCUMENTS

| 4,256,778 | 3/1981 | Mizukami et al. | 427/10 |
| 4,328,298 | 5/1982 | Nester | 430/5 |
| 4,503,329 | 3/1985 | Yamaguchi et al. | 250/309 |
| 4,751,169 | 6/1988 | Behringer et al. | 430/296 |

FOREIGN PATENT DOCUMENTS

| 58-52821 | 3/1983 | Japan | 430/5 |
| 58-111317 | 7/1983 | Japan | |
| 60-234320 | 11/1985 | Japan | |

OTHER PUBLICATIONS

Patent Abstracts of Japan, vol. 6, No. 185 (E-132) [1063], 21st Sep. 1982; and JP-A-57 100 727 (Toppan Insatsu K.K.) 23-06-1982.
Patent Abstracts of Japan, vol. 8, No. 13 (E-222) [1450], 20th Jan. 1984 and JP-A-58 178 521 (Hitachi Seisakusho K.K.) 19-10-1983.
Patent Abstracts of Japan, vol. 6 No. 264 (E-150) [1142], 23rd Dec. 1982; and JP-A-57 160 129 (Mitsubishi Denki K.K.) 02-10-1982.
"Characteristics of Tungsten Film by Focused Ion Beam CVD", Drafts for Joint Lecture and Meeting of 33rd meeting of Applied Physics Society p. 339.
"Applications of Focused Ion Beams to Microlithography" by Alfred Wagner, Solid State Technology/May 1983 pp. 97-103.

Primary Examiner—Jose G. Dees
Attorney, Agent, or Firm—Kenyon & Kenyon

[57] ABSTRACT

A method of correcting a circuit pattern such as an X-ray mask, carried out by first preparing a circuit pattern structure where a circuit pattern on a conductive film is coated with a protective film, then forming a hole or a slit by irradiating a high-intensity focused ion beam to a dropout defective portion in the circuit pattern of the circuit pattern structure, and plating such hole or slit while utilizing the conductive film as a plating electrode, thereby forming a metal frame to correct the dropout defective portion.

6 Claims, 6 Drawing Sheets

FIG. 1
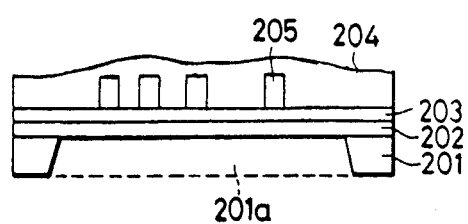
FIG. 2
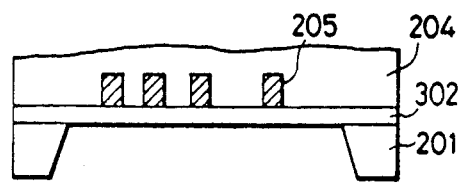
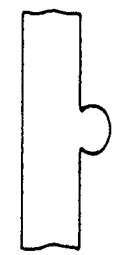
FIG. 3(a)
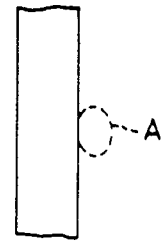
FIG. 3(b)
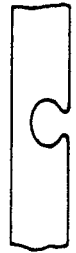
FIG. 3(c)
FIG. 3(d)

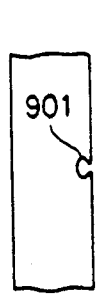  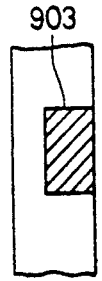
FIG.9(a)　　FIG.9(b)　　FIG.9(c)
FIG.10(a)
FIG.10(b)

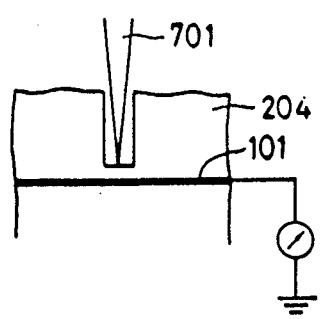
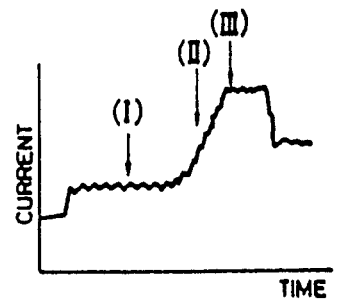
FIG. 11(a)    FIG. 11(b)
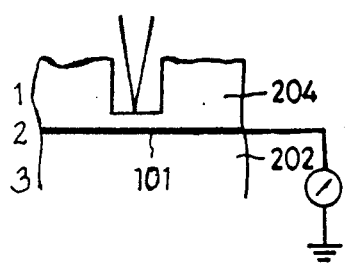
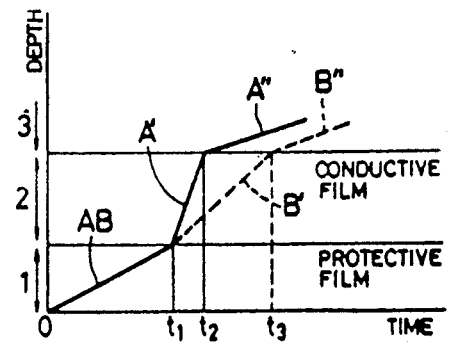
FIG. 12(a)    FIG. 12(b)

METHOD OF CORRECTING DEFECT IN CIRCUIT PATTERN

BACKGROUND OF THE INVENTION

1. Field of the Invention:

The present invention relates to a method for correction of a defect in a circuit pattern having a protective film such as an X-ray exposure mask used to form an extremely fine pattern of a magnetic bubble device, a semiconductor integrated circuit or the like.

2. Description of the Prior Art:

With the recent trend toward enhancing the integration density of semiconductor integrated circuit elements and so forth, an X-ray exposure process is generally applied as a means for forming a fine pattern. According to this process, first a heavy metal pattern is formed on a thin backing member to serve as an X-ray absorber, subsequently an element such as a silicon wafer is coated with an X-ray sensitive resist, which is then exposed to X-rays. Since the X-ray wavelength is far shorter than that of light, a high precision is attainable in forming a pattern with another advantage of satisfactory adaptability for mass production.

FIGS. 1 and 2 illustrate exemplary structures of such X-ray exposure mask (hereinafter referred to simply as X-ray mask). In the example of FIG. 1, a thin film 202 of boron nitride BN is formed on a mask frame 201 composed of a silicon wafer. A central portion of the mask frame 201 composed of silicon wafer is removed by etching so that a window 201a is formed for achieving ready permeation of X-rays. After a plating electrode 203, permeable to X-rays, is formed thereon, a heavy metal pattern 205 is formed by plating and then is coated with a protective film 204.

In another example illustrated in FIG. 2, a thin film 302 of silicon nitride or the like is formed on a mask frame 201 composed of a silicon substrate and, after a heavy metal is deposited thereon, its pattern 205 is formed by dry etching and then is coated with a protective film 204.

In the patterns 205 - 205 and 205 mentioned, defects are caused by some extraneous substances or the like. FIG. 3 illustrates examples of such defects, in which (A) represents a black spot defect where the pattern is deposited in excess, and (B) represents a white spot defect where the pattern is dropped out.

If any of such defective masks is transferred, it directly brings about a defect in the resultant pattern of an LSI, and therefore the defect needs to be corrected in the stage of forming a mask.

However, the X-ray mask pattern is as fine as 0.5 $\mu$m or less and still has a height of 0.5 $\mu$m or more for absorbing X-rays.

It has been customary heretofore to employ a laser for correction of any black spot defect in a photo mask, but complete correction of such fine pattern is technically difficult due to the thermal process and the limitation in the laser beam convergence. In an attempt to solve the problems mentioned, there is currently carried out an improved method which performs desired correction by the use of a submicron focused ion beam, as disclosed in Japanese Patent Laid-open No. 58 (1983)-56332 (U.S. Pat. No. 4,503,329) "Method and Apparatus for Correcting Defect in Mask".

However, while the above method is effective for correction of black spot defects it is not directly applicable to the correction of white spot defects.

With regard to white spot defects, a method based on the deposition of a heavy metal is effective as described in Minafuji et al. "Characteristics of Tungsten Film by Focused Ion Beam CVD" (Drafts for Joint Lecture in 33rd Meeting of Applied Physics Society, p. 339). A particularly remarkable effect is supposed to be achieved by the method which locally decomposes and separates a metal compound by the use of an ion beam.

The above methods, however, still include a problem relative to the contamination of a vacuum receptacle, an ion source, an ion-beam optical system and so forth with organic metal gas and are therefore not satisfactory for practical use. Furthermore, the gases employed in the above are mostly dangerous ones with respect to the properties of ignition, poison and corrosion. As a result, measures for maintaining safety are required which eventually cause a higher production cost for the apparatus.

As for other related art, there are additional techniques for defect correction. One is described in Japanese Patent Laid-open No. 58 (1983)-111317. This document discloses a photo mask correcting method characterized by electroless-plating of the photo mask, thereby forming a metal film on its defective portion such as a pin hole, to be non-transparent. Another technique is disclosed in Japanese Patent Laid-open No. 60 (1985)-234320. This document discloses an improvement of correcting a defect in a photo mask having a dropout in a portion of a pattern, characterized by first executing an electrolytic or electroless-plating step while converging and irradiating a laser beam of a wavelength shorter than 1.3 $\mu$m, and increasing the plating speed in the portion being irradiated with the laser beam, thereby selectively depositing a metal and correcting the dropout.

SUMMARY OF THE INVENTION

In order to solve the problems in the art mentioned above, it is an object of the present invention to provide an improved method capable of correcting a white spot defect (dropout defect), which is existent in a circuit pattern having a protective film such as an X-ray mask or the like. The method safely corrects the defect at low cost and practically without causing contamination of a vacuum receptacle, an ion source or an ion-beam optical system.

The present invention comprises the steps of initially forming a conductive film under a circuit pattern having a protective film like an X-ray absorbing metal (Au) pattern of an X-ray mask, subsequently boring the protective film in a dropout defective portion by the use of a high-intensity focused ion beam to expose the conductive film partially, and then plating the defective portion with a heavy metal while utilizing such exposed conductive film as a plating electrode, thereby correcting the dropout defect on the circuit pattern.

Thus, the feature of the present invention resides in that a dropout defective portion of a circuit pattern coated with a protective film is detected and then is irradiated with a high-intensity ion beam, so that a hole is bored accurately down to the vicinity of a conductive film formed under the circuit pattern, and the dropout defect on the circuit pattern is corrected by plating executed through such hole.

In this manner, any dropout defect (which does not exist a circuit pattern) in an X-ray mask or the like can be corrected within a short period of time to consequently render the X-ray mask satisfactory for practical use.

BRIEF DESCRIPTION OF THE DRAWINGS

FIG. 1 is a sectional view of an X-ray mask produced by a plating process;

FIG. 2 is a sectional view of another X-ray mask produced by a dry etching process;

FIG. 3 illustrates a black spot defect and a white spot defect in a mask and the states thereof posterior to correction;

FIG. 9 illustrates the problems existing in correction of a white spot defect;

FIG. 10 shows exemplary defects;

FIG. 11 shows an embodiment using a depth monitor; and

FIG. 12 shows another embodiment using a depth monitor.

DETAILED DESCRIPTION OF THE PREFERRED EMBODIMENT

Figure 4A:
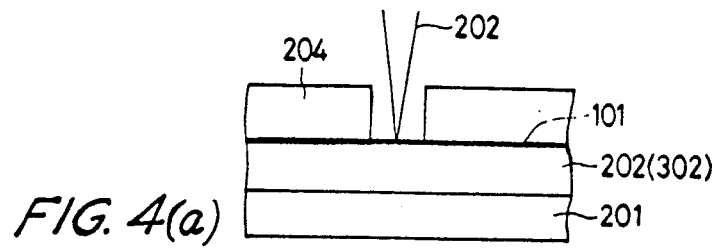
FIG. 4 is a sectional view of a sample illustrating the technique of white spot correction by the plating process according to the present invention.

FIG. 4 shows a means for correcting a white spot defect in an X-ray mask according to the present invention. When an X-ray mask is produced by a plating process as illustrated in FIG. 1, a plating electrode is formed immediately below a heavy metal circuit pattern 205. Meanwhile, when such X-ray mask is produced by a dry etching process as illustrated in FIG. 2, a conductive material 101 is deposited correspondingly to the plating electrode. First, a protective film 204 is bored in its portion corresponding to the white spot defect by the use of a focused ion beam 102, whereby the conductive film 101 is partially exposed.

Figure 4B:
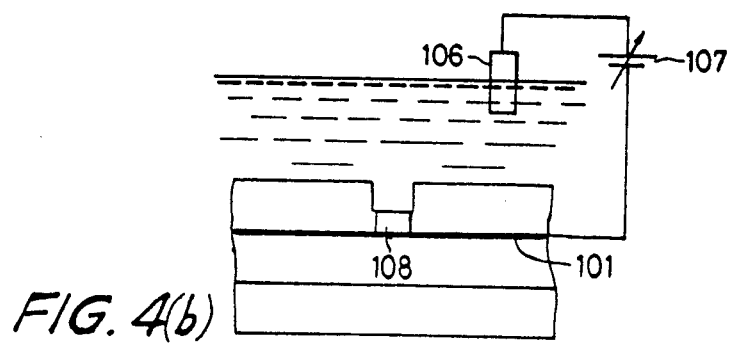

Subsequently, as shown in FIG. 4(b), the entire X-ray mask is immersed in a heavy metal plating solution (e.g. non-cyanic plating solution), and a voltage 107 is applied between the conductive film 101 and the heavy metal electrode 106 of the X-ray mask, so that a heavy metal film 108 is formed by the plating in the portion of the conductive film 101 exposed by previously boring the protective film 204 with an ion beam, thereby correcting the white spot defect.

Figures 5A, 5B:
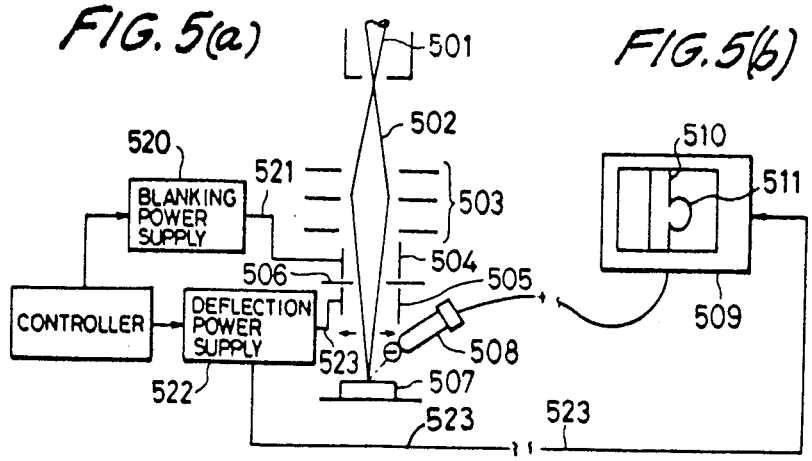
FIG. 5 shows a first embodiment designed to carry out the invention.

FIG. 5 shows a first embodiment designed to carry out the method of the present invention. (Specifically described in U.S. Pat. No. 4,503,329) An ion beam emitted from a fluid metal ion source 501 is converged by an electrostatic lens 503 and then is deflected by a combination of a blanking electrode 504 and a blanking aperture 506, which are driven in response to a blanking signal 521 from a blanking power supply 520, and a deflection electrode 505 driven in response to a deflection signal 523 from a deflection power supply 522. Subsequently the ion beam thus deflected is irradiated onto a workpiece 507. Denoted by 524 is a controller disposed for controlling the blanking power supply 520, the deflection power supply 522, the electrostatic lens 503 and so forth. In this stage, secondary charged particles (including secondary electrons and secondary ions) emitted from the workpiece are caught by a detector 508, and a resultant scanned ion image is visually represented on a display 509 in accordance with the deflection signal 523, whereby the circuit pattern 510 and the defect 511 of the X-ray mask are detected.

Figure 6A:
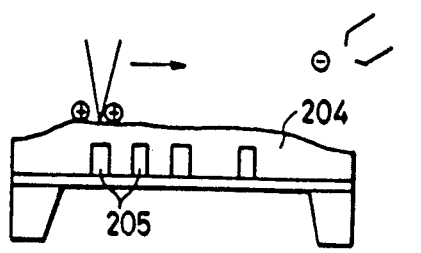
FIG. 6 shows a second embodiment designed to carry out the invention.
Figure 6B:
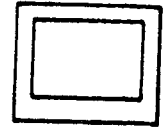

However, as illustrated in FIG. 6, the X-ray mask is generally so composed that the absorber (Au) circuit pattern 205 is coated with a protective film 204 of polyimide or the like. The protective film 204 is formed in a thickness of more than 1 μm on the upper portion of the absorber circuit pattern 205, but the surface unevenness of the protective film 204 is not conformable with that of the absorber circuit pattern 205 therebelow.

Figure 7:
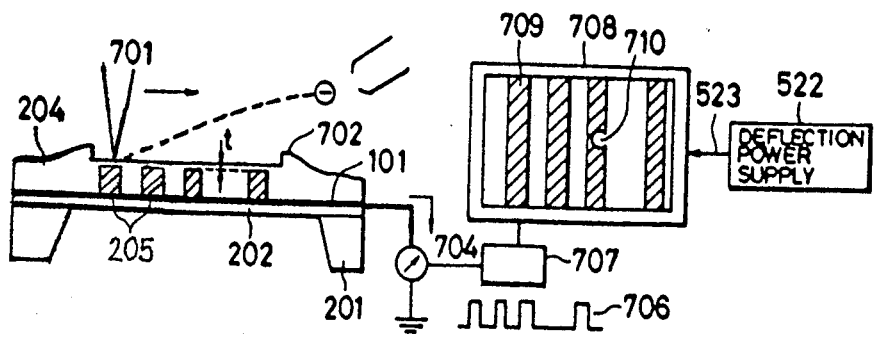
FIG. 7 shows a third embodiment designed to carry out the invention.

Accordingly, as illustrated in FIG. 7, a wide area of the protective film 204 is scanned by an ion beam 701 and then the surface thereof is processed. In this stage, when a detection is performed with a current fed to a detector 704 from the conductive film 101 formed under the absorber circuit pattern 205, the current flowing toward the detector 704 tends to overlap as denoted by reference numeral 706 in the case where the ion beam passes through the upper portion of the absorber circuit pattern 205 and in the place where the protective film 204 alone is existent without the absorber. Such tendency becomes more marked with reduction of the thickness t of the protective film 204 left on the absorber (Au) circuit pattern 205 posterior to the process. When necessary, operations of removing the noise and shaping the signal waveform are performed by an image processor 707 for the surface scanning with the ion beam on the basis of the deflection signal 523, and the image is visually represented on the display 708, whereby the pattern 709 and the defect 710 can be detected. Subsequently the portion of the protective film corresponding to the white spot defect 710 is processed. The succeeding operation is the same as described previously.

Figure 8B:
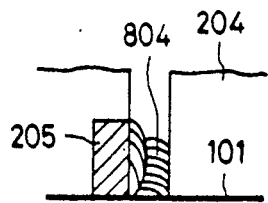
FIG. 8 illustrates exemplary correction of a white spot defect in a pattern.
Figure 8C:
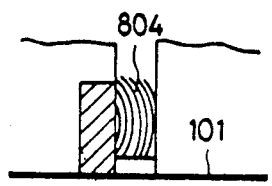
Figure 8A:
Figure 8D:
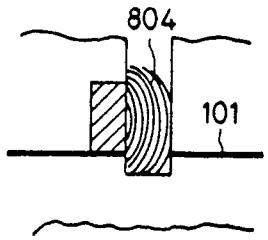

FIG. 8(a) illustrates an exemplary defective circuit pattern with a white spot (dropout) defect. For correction of such dropout defect, the protective film 204 is bored by a focused ion beam down to the conductive film 101 as illustrated in FIG. 8(b), and in the next plating step, the lateral surface of the absorber metal pattern 205 also serves as a plating electrode in addition to the conductive film 101, so that a plating metal film grows therefrom as well. Generally the conductive film needs to be thin for minimizing the amount of absorption of X-rays, and therefore it is difficult to interrupt the plating exactly in the region of the conductive film. Considering the growth of the plating metal film on the lateral surface of the circuit pattern 205, effective correction of the white spot defect can be achieved due to the growth of the plating electrode 804 from the lateral surface of the pattern 205 even when the end of the hole formed by the focused ion beam is not exactly coincident with the conductive film as illustrated in FIG. 8(c) where a lower portion of the protective film 204 is still slightly left, or as illustrated in FIG. 8(d) where the boring is executed excessively beyond the conductive film.

FIG. 9 shows an example where a white spot defect is extremely small as 0.1 μm or so. In this case, a plating solution may fail to enter the hole formed in the protective film 204 of polyimide and consequently no plating film grows therein. Therefore, a wide area 902 surrounding the white spot defect is bored by a focused ion beam as illustrated in FIG. 9(b), and subsequently a plating film 903 is formed as mentioned previously to perform rapid correction of the white spot defect.

In another example having a white spot defect isolated from the peripheral region as illustrated in FIG. 10(a) or when there exists a large defect as illustrated in (b), it is impossible to correct the white spot defect by the growth of a plating metal from the lateral surface of the pattern, and therefore the focused ion beam needs to be retained accurately on the exposed conductive film. However, since the conductive film is extremely thin (e.g. 0.1 μm) as mentioned, such retention is technically difficult.

FIG. 11 illustrates how high-precision depth monitoring is executed for such purpose. When a current from the conductive film 101 is detected while the protective film 204 is bored as shown in (a), the current indicates a small value (I) during the boring process of the protective film 204 as shown in FIG. 11 (b), but with gradual approach of the hole bottom to the conductive film, the current leaks through the remaining thin portion of the protective film and sharply increases in flowing into the conductive film 101 as represented by (II).

Therefore, by halting the ion beam at a point (III) of the maximum current increase, the boring can be terminated exactly upon arrival at the conductive film to eventually enable proper correction of the white spot defect with satisfactory plating.

Although in the above example the monitoring is executed by detection of the current from the conductive film 101, it is also possible to achieve accurate monitoring by detection of the secondary electrons, secondary ions and fluorescent reflected electrons emitted from the workpiece (surface of X-ray mask) and the changes in the quantities thereof.

FIG. 12 illustrates an embodiment for executing accurate depth monitoring as in the foregoing example.

As graphically shown in FIG. 12(b), the protective film 104 is bored at a constant speed. In case an ordinary conductive material such as gold, Au, is used for the conductive film, the boring speed is high as represented by A', and consequently the required time t2−t1 is short. Therefore it is difficult to attain high-precision depth monitoring on the basis of measuring such short boring time with the ion beam. For this reason, the conductive-film boring speed is lowered to B' by replacing the ordinary material of the conductive film with another material such as nickel Ni of a lower sputtering rate, whereby the boring time is prolonged as t3−t1. Thus, the monitoring can be executed with a high precision by controlling such boring time.

Regarding the materials of upper and lower layers of the conductive film and the characteristics of the plating electrode, the conductive film may be shaped into a multilayer structure which is composed of several kinds of metals. In such a case also, the same effect as mentioned can be attained by selectively employing a material of a lower sputtering rate to prolong the boring time.

A description has been given above on the electroplating as a method for deposition of metal. Such plating need not exactly be performed at a fixed voltage, and application of pulses, for example, can be adopted for the plating.

Furthermore, the technique of electroless plating is adoptable as well.

In the method described, an additional step of forming another protective film of polyimide or the like may be carried out, if necessary, to protect the film in the portion corrected by the plating.

Although exemplary correction of a white spot defect in an X-ray mask has been described hereinabove, it is to be understood that, generally in any device (e.g. LSI) with a protective film formed on a circuit pattern, the present invention can be applied also to a method which bores the protective film by a focused ion beam to make a hole or a slit therein and then forms a metal film in the bored portion by means of plating to correct the pattern.

According to the present invention, as mentioned hereinabove, a dropout defect in a circuit pattern having a protective film such as an X-ray mask or the like can be corrected with safety and at low cost, practically without causing contamination of a vacuum receptacle, an ion source or an ion-beam optical system.

Furthermore, in comparison with the CVD method using a focused ion beam or the like, the required correction time can be shortened since a great quantity of X-ray masks can be plated and corrected at a time.

What is claimed is:

1. A circuit pattern correcting method comprising the steps of:

preparing a circuit pattern structure where a circuit pattern on a conductive film is coated with a protective film;

removing a wide area of the protective film of the circuit pattern structure so as to reduce a thickness of the protective film by irradiating with a scan of a high-intensity focused ion beam;

visually detecting a dropout portion of said circuit pattern by displaying an image of the circuit pattern for a wide area of the circuit pattern that was scanned in said step of removing a wide area of the protective film and by detecting a current flowing in said conductive film in accordance with the scanning of said ion beam, on a displaying means;

forming a hole or a slit in the protective film of reduced thickness by irradiating by scanning with the high-intensity focused ion beam aligned to the dropout defective portion detected by the display means; and plating said hole or slit while utilizing said conductive film as a plating electrode, thereby forming a metal film to correct said dropout defective portion.

2. A method according to claim 1, wherein said hole or slit is formed by detecting a time variation of the current flowing in said conductive film.

3. A method according to claim 1, wherein said dropout defective portion is detected by displaying the image of the circuit pattern obtained by detecting secondary charged particles emitted from said wire area of the exposed circuit pattern.

4. A method according to claim 2, wherein said conductive film is composed of a metal film containing nickel or the like which is not processed readily by said high-intensity focused ion beam, whereby said hole or slit can be formed accurately to said conductive film.

5. A method according to claim 2, wherein said circuit pattern structure is an X-ray exposure mask.

6. A method according to claim 2, wherein, when said dropout defect is extremely small, said hole or slit is formed in a wider region inclusive of said circuit pattern, and said region is plated to correct the defective portion.

* * * * *